US012176275B2

(12) United States Patent
Yandoc et al.

(10) Patent No.: US 12,176,275 B2
(45) Date of Patent: Dec. 24, 2024

(54) SEMICONDUCTOR DEVICE AND A METHOD OF MANUFACTURING A SEMICONDUCTOR DEVICE

(71) Applicant: NEXPERIA B.V., Nijmegen (NL)

(72) Inventors: Ricardo Yandoc, Nijmegen (NL); Dilder Chowdhury, Nijmegen (NL); Ilyas Dchar, Nijmegen (NL)

(73) Assignee: NEXPERIA B.V., Nijmegen (NL)

( * ) Notice: Subject to any disclaimer, the term of this patent is extended or adjusted under 35 U.S.C. 154(b) by 384 days.

(21) Appl. No.: 17/672,241

(22) Filed: Feb. 15, 2022

(65) Prior Publication Data
US 2022/0262712 A1    Aug. 18, 2022

(30) Foreign Application Priority Data
Feb. 16, 2021   (EP) .................................. 21157354

(51) Int. Cl.
| | |
|---|---|
| *H01L 23/495* | (2006.01) |
| *H01L 21/48* | (2006.01) |
| *H01L 21/56* | (2006.01) |
| *H01L 23/31* | (2006.01) |
| *H01L 25/07* | (2006.01) |

(52) U.S. Cl.
CPC .... *H01L 23/49575* (2013.01); *H01L 21/4825* (2013.01); *H01L 21/4842* (2013.01); *H01L 21/565* (2013.01); *H01L 23/3107* (2013.01); *H01L 23/4951* (2013.01); *H01L 23/49562* (2013.01); *H01L 23/49568* (2013.01); *H01L 25/071* (2013.01); *H01L 25/074* (2013.01)

(58) Field of Classification Search
CPC ........................... H01L 25/071; H01L 25/074
See application file for complete search history.

(56) References Cited

U.S. PATENT DOCUMENTS

| | | | |
|---|---|---|---|
| 9,741,702 B2 * | 8/2017 | Wu | ..................... H01L 29/2003 |
| 2005/0224945 A1 | 10/2005 | Saito et al. | |
| 2009/0212405 A1 | 8/2009 | Liu et al. | |
| 2011/0227207 A1 | 9/2011 | Yilmaz et al. | |
| 2014/0175454 A1 | 6/2014 | Roberts et al. | |
| 2014/0217596 A1 | 8/2014 | Otremba et al. | |
| 2014/0264804 A1 | 9/2014 | Terrill et al. | |
| 2014/0284777 A1 | 9/2014 | Otremba et al. | |
| 2016/0233859 A1 * | 8/2016 | Roberts | ............... H01L 29/7787 |
| 2017/0256538 A1 * | 9/2017 | Lu | ....................... H01L 29/2003 |
| 2017/0317001 A1 * | 11/2017 | Otremba | .................. H01L 24/48 |
| 2018/0145674 A1 * | 5/2018 | Bunin | ................. H03K 17/0828 |

(Continued)

FOREIGN PATENT DOCUMENTS

EP        3385981 A1    10/2018

OTHER PUBLICATIONS

Extended European Search Report and Written Opinion for corresponding European application EP21157354.8, 6 pages dated Jul. 8, 2021.

*Primary Examiner* — Eugene Lee
(74) *Attorney, Agent, or Firm* — Ruggiero McAllister & McMahon LLC

(57) ABSTRACT

A semiconductor device is provided, including a MOSFET die, a first GaN die and a second GaN die. The first GaN die and the second GaN die are arranged in a cascode arrangement. The second GaN die is positioned in an inverted orientation. The MOSFET die controls the first GaN die and the second GaN die.

17 Claims, 3 Drawing Sheets

(56) References Cited

U.S. PATENT DOCUMENTS

| | | | |
|---|---|---|---|
| 2018/0174986 A1* | 6/2018 | Tamura | H03K 17/168 |
| 2018/0233481 A1* | 8/2018 | Bahl | H01L 24/97 |
| 2020/0116763 A1* | 4/2020 | Parkhideh | G01R 31/40 |
| 2020/0389130 A1* | 12/2020 | Schultz | H04B 1/0458 |
| 2021/0258011 A1* | 8/2021 | Ikeuchi | H03K 17/145 |

* cited by examiner

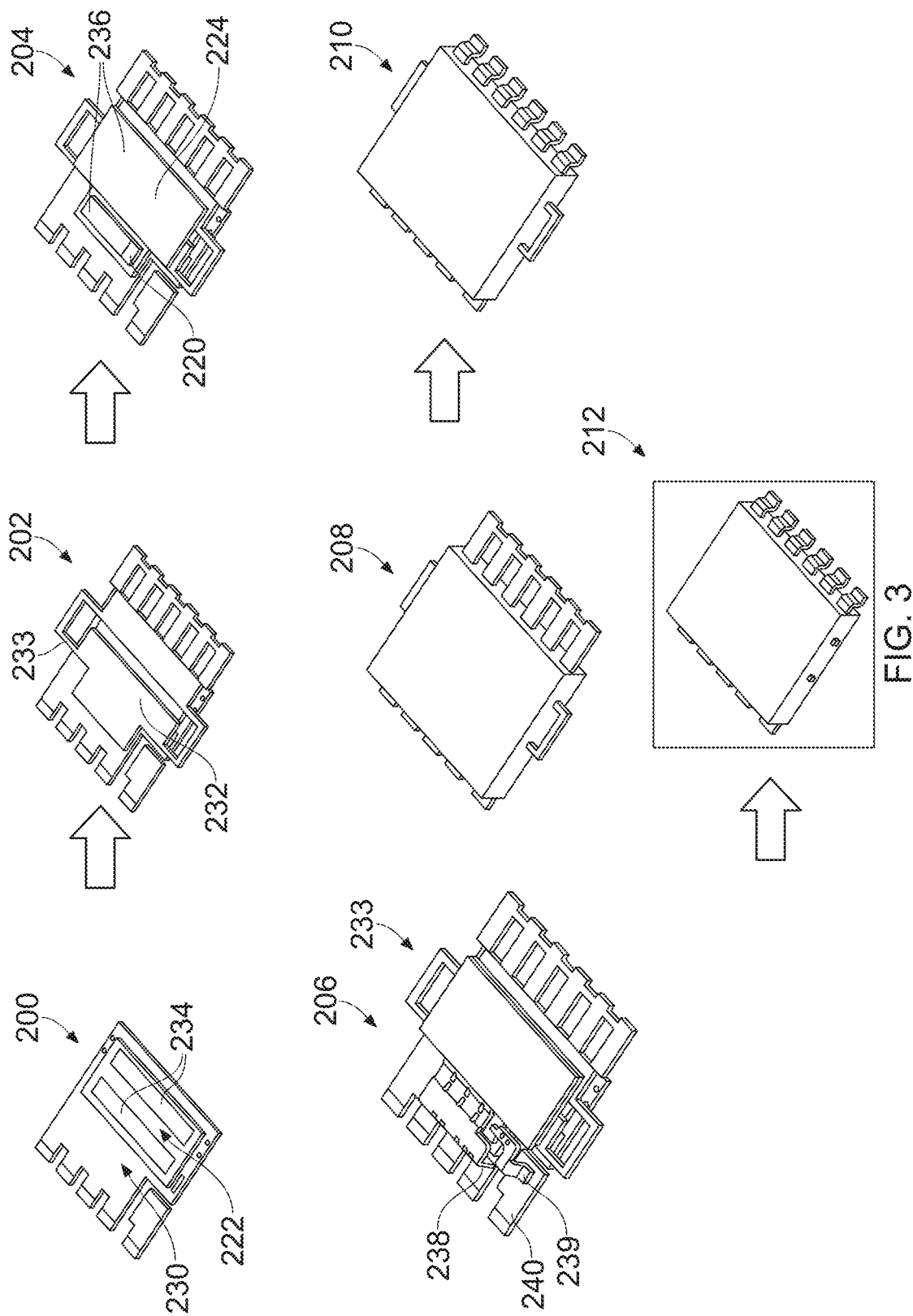

SEMICONDUCTOR DEVICE AND A METHOD OF MANUFACTURING A SEMICONDUCTOR DEVICE

CROSS REFERENCE TO RELATED APPLICATION

This application claims the benefit under 35 U.S.C. § 119(a) of European Application No. 21157354.8 filed Feb. 16, 2021, the contents of which are incorporated by reference herein in their entirety.

BACKGROUND OF THE DISCLOSURE

1. Field of the Disclosure

The present disclosure relates to a semiconductor device comprising a MOSFET die and two GaN dies that are arranged in a cascode configuration. The disclosure also relates to a method of manufacturing a semiconductor device.

2. Description of the Related Art

It is known in the art that GaN technology and specifically GaN-on-Silicon HEMT technology has become very interesting over the last few years. The GaN technology can be used for applications that require the high-power performance and high-frequency switching. The GaN technology is optimistic applicant for future high-power and high-frequency applications, it is very promising for future power and high frequency applications. In particular, the GaN high electron mobility transistor (HEMT) grown on Si substrate is suitable for high frequency and high power switching applications.

Taking into account the physical and electrical nature of GaN HEMT devices, there is one obvious challenge. A GaN HEMT's natural operation mode is as a depletion mode FET with a naturally "on" state. That is different from a stereotype where the devices are naturally "off" devices. There is also a benefit with "off" devices from a safety perspective. Therefore, a work around of the natural state of GaN HEMTs is needed to deliver naturally "off" operation. Currently there are two main approaches to this challenge. One is to change the structure of the device to operate in enhancement mode (or e-mode). The second is a stacked die cascode packaged device, shown in FIG. 1a, with a naturally "off" low-voltage, low RDSon silicon MOSFET 12 placed in series to the naturally "on" GaN HEMT device 10. The device shown in FIG. 1a is an example of a single cascode circuit known in the art.

Another device known in the art is shown in FIG. 1b. In this case a single FET 18 is used to control two HEMT devices, a first HEMT device 14 and a second HEMT device 16. It is also noted that a skilled person can use a single FET to control two or multiple HEMT devices.

Normally GaN surface mount packages are used instead of traditional through-hole packages with a goal to reduce the package resistance, parasitic inductances and also the size of a product device. This also helps increasing the power density.

Furthermore, it is advantageous GaN package using a copper (Cu) clip interconnects design, since that improves the package resistance and inductance in a smaller footprint.

The disadvantage of the semiconductor devices as described above is that for multiple fast switching packaged devices that are in parallel layout, it is very difficult to achieve a stable performance.

SUMMARY

Various example embodiments are directed to the disadvantage as described above and/or others which may become apparent from the following disclosure.

According to an embodiment of this disclosure a semiconductor device comprises a MOSFET die, a first GaN die and a second GaN die. The first GaN die and the second GaN die are arranged in a cascode arrangement. In such configuration, the first GaN die is positioned in a normal/non-inverted orientation. The second GaN die is positioned in an inverted orientation.

The MOSFET die controls the first GaN die and the second GaN die. The semiconductor device can further comprise a first clip with two independent parts that are connected by a tie bar. A first part of the first clip is positioned on the top of a source pad of the first GaN die. This first part of the first clip, which is connected to the source pad of the first GaN die, will act as a die paddle for the MOSFET, while a second part of the first clip is a drain connection of the first GaN die.

The semiconductor device can further comprise a second and common attach clip with pillars. The second attach clip is positioned on the top of the second GaN die, so to connect the gates of both, the first GaN die and the second GaN die, to the source of the MOSFET die.

The MOSFET's drain, attached on the first clip/die paddle, is connected to a common source terminal of both, the first GaN die and the second GaN die.

The drain of the second GaN die is also using a common terminal, which is extended to the outside of package, forming gull wing leads.

The semiconductor device as described in the above embodiments can also realize by a skilled person with a bottom cooling or with a dual cooling.

The disclosure also relates to a method of producing a semiconductor device. The method comprises the following steps:

Print/deposit a first solder or adhesive and attach a first GaN die on a die pad of a semiconductor device, print/deposit a second solder or adhesive on a drain pad and on a source pad of the first GaN die, attach a first two parts clip with tie bars on the top of the first GaN die, print/deposit the third solder or adhesive on the first two parts clip, attach a MOSFET die, attach a second GaN die in an upside-down/flipped orientation, print/deposit a fourth solder or adhesive on the top of the MOSFET die and the second GaN die, attach a second clip with pillars on the top of the MOSFET die and the second GaN die, so to connect both, a gate of the first GaN die and a gate of the second GaN die to a source of the MOSFET die, and attach a gate clip, or any interconnect such as wire or ribbon, for the MOSFET die so to complete the circuit.

Furthermore, the method can comprise other steps common in the production of the semiconductor devices:

moulding, deflash, plating, trim, form, cutting external tie bars, and
singulation.

The semiconductor device according to the above described embodiments, wherein the first GaN die and the second GaN die are stacked, secures very stable performance. It is much better performance compared to the known semiconductor device wherein the first GaN die and the second GaN die are arranged in a parallel layout.

Such an arrangement, wherein the first GaN die and the second GaN die are stacked ensures more consistent performance of the device, in particular a low package resistance and low parasitic inductances. Also the size of semiconductor device is significantly reduced, which makes this disclosure very cost effective.

Furthermore, the disclosure describes an inventive arrangement/layout that allows very good thermal control of the package/semiconductor device.

BRIEF DESCRIPTION OF THE DRAWINGS

So that the manner in which the features of the present disclosure can be understood in detail, a more particular description is made with reference to embodiments, some of which are illustrated in the appended figures. It is to be noted, however, that the appended figures illustrate only typical embodiments and are therefore not to be considered limiting of its scope. The figures are for facilitating an understanding of the disclosure and thus are not necessarily drawn to scale. Advantages of the subject matter claimed will become apparent to those skilled in the art upon reading this description in conjunction with the accompanying figures, in which like reference numerals have been used to designate like elements, and in which:

FIG. 3 illustrates a method of manufacturing a semiconductor device according to an embodiment of the disclosure.

DETAILED DESCRIPTION

Figure 1B:
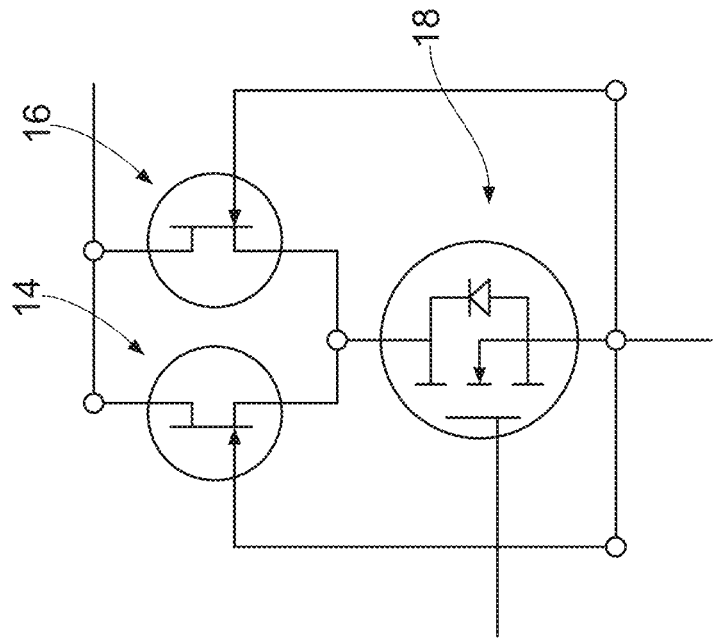
FIGS. 1a and 1b show known semiconductor devices.
Figure 1A:
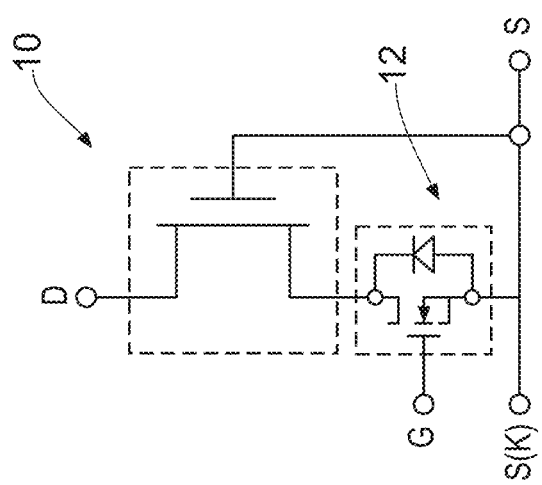
Figure 2:
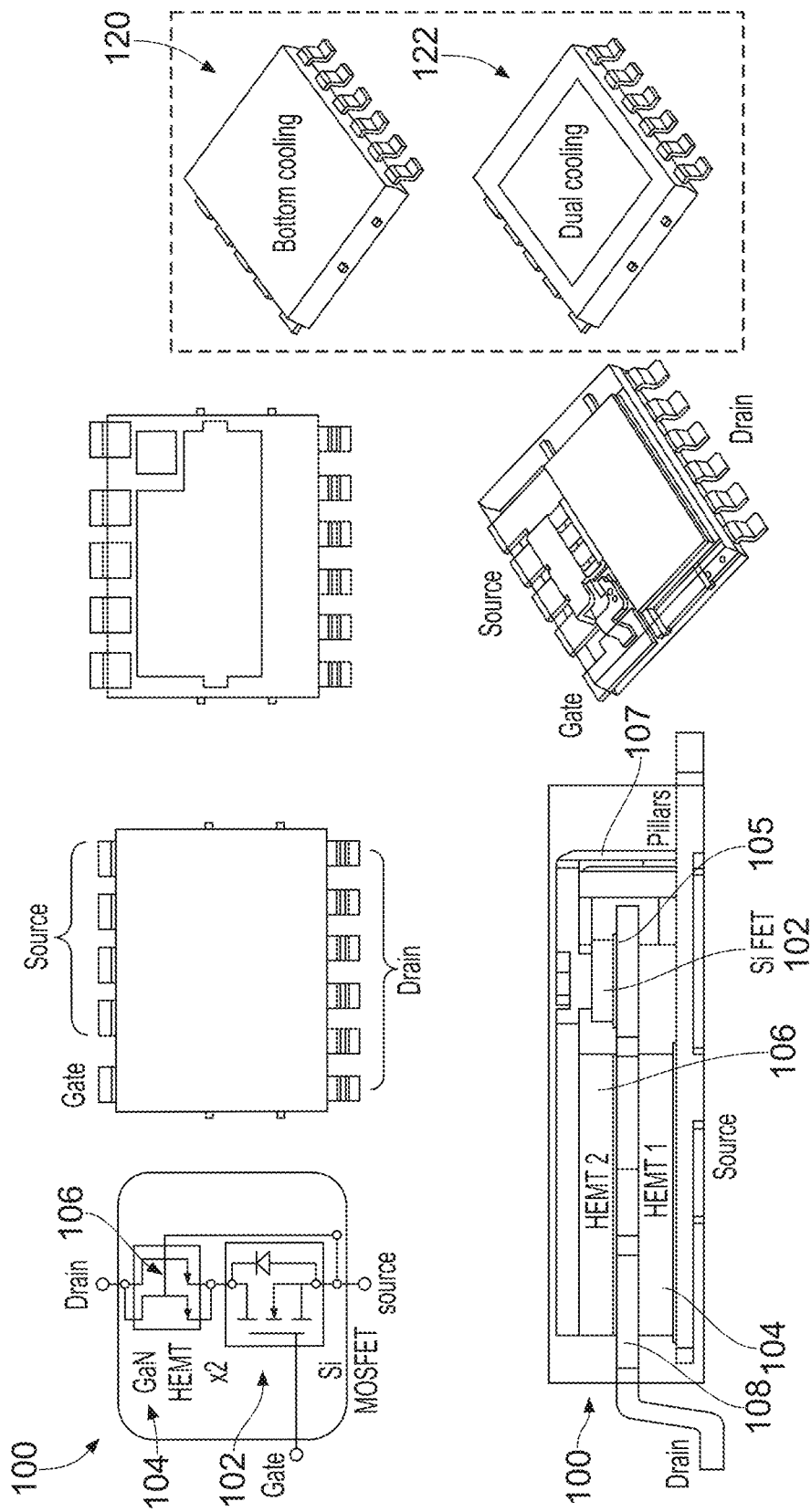
FIG. 2 illustrates a semiconductor device according to an embodiment of the disclosure.

FIG. 2 illustrates an embodiment of the present disclosure. A semiconductor device package 100 comprises a metal oxide semiconductor field effect transistor (MOSFET) die 102 and two GaN dies 104 and 106, a first GaN die 104 and a second GaN die 104. The first GaN die 104 and the second GaN die 106 are arranged in a cascode formation, i.e. stacked. The MOSFET die 102 is arranged to drive or switch both, the first GaN die 104 and the second GaN die 106. The MOSFET die can be also a FET die. The first GaN die can be a first HEMT die. The second GaN die can be a second HEMT die.

Such an arrangement within the semiconductor device 100, wherein the first GaN die 104 and the second GaN die 106 are stacked ensures that the semiconductor is significantly reduced in size and also better electrical performances.

In an embodiment of the present disclosure a first GaN die 104 is positioned in a normal, i.e. usual orientation, wherein a drain and a source of the first GaN die 104 are pointing upwards within the semiconductor device 100. A second GaN die 106 is positioned in an opposite orientation, wherein a drain and a source of the second GaN die 106 are pointing downwards within the semiconductor device 100.

A first two parts clip 108 and 105, integrated by a tie bar (not shown in the figures) are used on the top of the first GaN 104. The first part becomes a die paddle 105 of the MOSFET die 102 while the second part will be the common drain clip 108 of the first GaN die 104 and the second GaN die 106. A second attach clip with pillars 107 is used-on the top of a second GaN die 106, so to connect the gates of both the first GaN die 104 and the second GaN die 106 to the source of the MOSFET die 102.

Moreover, the MOSFET die is attached on the die paddle 105, as a MOSFET die drain, connected to a common source terminal of both, the first GaN die 104 and the second GaN die 106. The drain of the second GaN die is also using a common terminal, which is extended to the outside of the semiconductor device, in this way forming gull wing leads, which significantly improves the respective board level reliability performance.

According to an embodiment of the present disclosure, the above described semiconductor device can be used for both, bottom cooling packages 120 and dual cooling packages 122, which are shown in FIG. 2.

According to an embodiment of the disclosure, a method of manufacturing a semiconductor device is disclosed. The semiconductor device comprises a MOSFET die, a first GaN die and a second GaN die stacked within the semiconductor device. The method is illustrated in FIG. 3.

The method comprises the steps:
reference sign 200 in FIG. 3:
  print or deposit a first solder or a first adhesive and attach a first GaN die 222 on a die pad 230 of a semiconductor device
  print or deposit a second solder or a second adhesive 234 on a drain pad and on a source pad of the first GaN die 222
reference sign 202 in FIG. 3:
  attach a first two parts clip 232 integrated by a tie bar 233 on the source and the drain of the first GaN die 222
reference sign 204 in FIG. 3:
  attach a MOSFET die 220
  attach a second GaN die 224 (wherein the source and drain solderable pads are not visible in FIG. 3) in an upside-down orientation
  print or deposit a third solder or a third adhesive 236 on top of the MOSFET die 220 and the second GaN die 224
reference sign 206 in FIG. 3:
  attach a second clip with pillars 238 on the top exposed surface of the MOSFET die 220 and the exposed surface of second GaN die 224, so to connect both, a gate of the first GaN die 222 and a gate of the second GaN die 224 to a source of the MOSFET die 220
  attach a third clip 239, or any interconnect such as wire or ribbon, on MOSFET gate towards a gate pad 240 so to complete the device circuit.
reference sign 208 in FIG. 3:
  moulding
  deflash
  plating
reference sign 210 in FIG. 3:
  dam bar cutting
  trim
  form
reference sign 212 in FIG. 3:
  cutting external tie bars, and
  singulation.

According to the embodiment of the present disclosure, as described above, the drain and the source of both, the first GaN die and the second GaN die, are connected through a two parts clip with external tie bars. The source terminals and the drain terminals of both, the first GaN die and the second GaN die, are disconnected by cutting the external tie bars.

The semiconductor device, wherein the first GaN die and the second GaN die are stacked secures very stable performance, compared to the known semiconductor devices wherein the first GaN die and the second GaN die are arranged in a parallel layout.

In general, a drain-source on resistance (RDSon) reduction can be achieved by increasing a GaN die size. However, making the Gan die too large, introduces limitations, e.g. spreading resistance, die aspect ratio, yield, assembly reliability, etc.

This problem is fully solved by a semiconductor device as described in the embodiments of the present disclosure. A clip-bonded GaN package with a single MOSFET die to control multiple GaN dies is advantageous due the following:
   allowing much more power to be switched by using multiple and parallel GaN dies:
      low parasitic inductances, low switching losses, and low RDSon, lower conduction losses.

Using only one large MOSFET die ensures that all the GaN dies switch at the same time. Such an inventive arrangement/layout allows very good thermal control of the package/semiconductor device.

This could be arranged as a bottom cooling package/semiconductor device, or a dual sided cooling package/semiconductor device.

Having the first GaN die and the second GaN die in a cascode arrangement is additionally a printed circuit board space saver, which makes this disclosure also very cost effective.

The present disclosure is not limited to the above described embodiments. All similar embodiments and obvious variations of the above embodiments are covered by the present disclosure. Some of the applications of the present disclosure include: a GaN package, a clip bonded package, a power semiconductor package, etc.

Particular and preferred aspects of the disclosure are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed disclosure or mitigate against any or all of the problems addressed by the present disclosure. The applicant hereby gives notice that new claims may be formulated to such features during prosecution of this application or of any such further application derived therefrom. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

The term "comprising" does not exclude other elements or steps, the term "a" or "an" does not exclude a plurality.

Reference signs in the claims shall not be construed as limiting the scope of the claims.

What is claimed is:

1. A semiconductor device comprising:
   a MOSFET die;
   a first GaN die and a second GaN die;
   wherein the first GaN die and the second GaN die are arranged in a cascode arrangement;
   wherein the second GaN die is positioned in an inverted orientation; and
   wherein the MOSFET die controls the first GaN die and the second GaN die.

2. The semiconductor device as claimed in claim 1, wherein the semiconductor device further comprises a first attach clip containing two parts, connected by tie bars.

3. The semiconductor device as claimed in claim 1, wherein the semiconductor device further comprises a second clip with pillars, the second clip positioned on the top of the second GaN die, so to connect the gates of both, the first GaN die and the second GaN die, to the source of the MOSFET die.

4. The semiconductor device as claimed in claim 1, wherein the MOSFET die is attached on a die paddle, as a MOSFET die drain, and wherein the MOSFET die drain is connected to a common source terminal of both the first GaN die and the second GaN die.

5. The semiconductor device as claimed in claim 1, wherein the semiconductor device comprises a bottom realized cooling or a dual realized cooling.

6. The semiconductor device as claimed in claim 2, wherein the first attach clip is positioned in between the first GaN die and the second GaN die, and wherein the first attach clip is a common source clip and a common drain clip of the first GaN die and the second GaN die.

7. The semiconductor device as claimed in claim 2, wherein the semiconductor device further comprises a second clip with pillars, the second clip positioned on the top of the second GaN die, so to connect the gates of both, the first GaN die and the second GaN die, to the source of the MOSFET die.

8. The semiconductor device as claimed in claim 2, wherein the MOSFET die is attached on a die paddle, as a MOSFET die drain, and wherein the MOSFET die drain is connected to a common source terminal of both the first GaN die and the second GaN die.

9. The semiconductor device as claimed in claim 2, wherein the semiconductor device comprises a bottom realized cooling or a dual realized cooling.

10. The semiconductor device as claimed in claim 6, wherein the MOSFET die is attached on a die paddle, as a MOSFET die drain, and wherein the MOSFET die drain is connected to a common source terminal of both the first GaN die and the second GaN die.

11. The semiconductor device as claimed in claim 6, wherein the semiconductor device further comprises a second clip with pillars, the second clip positioned on the top of the second GaN die, so to connect the gates of both, the first GaN die and the second GaN die, to the source of the MOSFET die.

12. The semiconductor device as claimed in claim 6, wherein the semiconductor device comprises a bottom realized cooling or a dual realized cooling.

13. The semiconductor device as claimed in claim 6, wherein the drain clip is extended towards outside the semiconductor device to form external leads.

14. The semiconductor device as claimed in claim 13, wherein the semiconductor device comprises a bottom realized cooling or a dual realized cooling.

15. The semiconductor device as claimed in claim 10, wherein the drain of the second GaN die is also connected to the common drain terminal, which is extended to the outside of the semiconductor device, so to form gull wing leads.

16. A method of producing a semiconductor device, the method comprising the steps of:
   printing or depositing a first solder or adhesive and attaching a first GaN die on a die pad of a semiconductor device;
   printing or depositing a second solder or adhesive on a drain pad and on a source pad of the first GaN die;
   attaching a first two parts clip with tie bars on a top of the first GaN die;
   printing or depositing a third solder or adhesive on the first two parts clip;
   attaching a MOSFET die;
   attaching a second GaN die in an upside-down or flipped orientation;
   printing or depositing a fourth solder or adhesive on a top of the MOSFET die and the second GaN die;
   attaching a second clip with pillars on the top of the MOSFET die and the second GaN die, to connect both a gate of the first GaN die and a gate of the second GaN die to a source of the MOSFET die; and
   attaching a third clip, or any interconnect such as wire or ribbon, on a MOSFET gate towards a gate pad.

17. A method of producing a semiconductor device as claimed in claim 7, wherein the method further comprises steps of:
   moulding;
   deflashing;
   plating;
   trimming;
   forming;
   cutting external tie bars; and
   singulation.

* * * * *